United States Patent
Koyama

(10) Patent No.: US 8,016,629 B2
(45) Date of Patent: Sep. 13, 2011

(54) METHOD OF PRODUCING A DISPLAY DEVICE

(75) Inventor: Tamami Koyama, Chiba (JP)

(73) Assignee: Showa Denko K.K., Tokyo (JP)

( * ) Notice: Subject to any disclaimer, the term of this patent is extended or adjusted under 35 U.S.C. 154(b) by 298 days.

(21) Appl. No.: 11/912,202

(22) PCT Filed: Apr. 20, 2006

(86) PCT No.: PCT/JP2006/308797
§ 371 (c)(1),
(2), (4) Date: Oct. 22, 2007

(87) PCT Pub. No.: WO2006/115283
PCT Pub. Date: Nov. 2, 2006

(65) Prior Publication Data
US 2009/0079330 A1    Mar. 26, 2009

Related U.S. Application Data

(60) Provisional application No. 60/677,415, filed on May 4, 2005.

(30) Foreign Application Priority Data

Apr. 25, 2005   (JP) .................................. 2005-126883

(51) Int. Cl.
*H01J 9/00*    (2006.01)
*H01J 9/24*    (2006.01)

(52) U.S. Cl. .......................................... 445/24; 445/23

(58) Field of Classification Search .................. 445/24, 445/23; 313/504; 428/690
See application file for complete search history.

(56) References Cited

U.S. PATENT DOCUMENTS

| 5,274,159 | A  | * | 12/1993 | Pellerite et al. | ............... 556/485 |
| 6,501,227 | B1 | * | 12/2002 | Koyama | ...................... 315/169.3 |
| 6,774,574 | B1 | * | 8/2004 | Koyama | ...................... 315/169.3 |
| 6,946,802 | B2 | * | 9/2005 | Hayashi | ...................... 315/169.3 |
| 6,969,291 | B2 | * | 11/2005 | Urabe et al. | ..................... 445/23 |

(Continued)

FOREIGN PATENT DOCUMENTS

| CN | 1429053 A | 7/2003 |
| EP | 1 225 472 A2 | 7/2002 |
| JP | 8-157575 A | 6/1996 |
| JP | 10-1665 A | 1/1998 |
| JP | 2000-323276 A | 11/2000 |
| JP | 2001-126867 A | 5/2001 |
| JP | 2002-305077 A | 10/2002 |
| JP | 2004-63210 A | 2/2004 |
| WO | 98/05187 A1 | 2/1998 |
| WO | 03/041452 A1 | 5/2003 |

OTHER PUBLICATIONS

A. Hozumi et al., Preparation of transparent water-repellent films by radio-frequency plasma-enhanced chemical vapour deposition, Journal Materials of Science, 1997, pp. 4253-4259, vol. 32.

*Primary Examiner* — Nimeshkumar Patel
*Assistant Examiner* — Glenn Zimmerman
(74) *Attorney, Agent, or Firm* — Sughrue Mion, PLLC

(57) ABSTRACT

The invention provides a method of producing an organic electroluminescent device comprising applying a composition containing an organic electroluminescent compound onto multiple electrodes to form an organic electroluminescent layer on each of the electrodes, wherein the substrate on which the composition is applied is a substrate with the portions between electrodes and/or the surface of the electrodes having been subjected to water-repellent treatment. By using this method, deterioration of a device and reduction in performance due to existence of an insulating layer which is indispensable for segregation of each polymer light-emitting compound in conventional process of applying polymer light-emitting compounds can be avoided.

23 Claims, 9 Drawing Sheets

U.S. PATENT DOCUMENTS

| | | |
|---|---|---|
| 7,009,339 B2 * | 3/2006 | Lee et al. .................. 313/504 |
| 7,498,739 B1 * | 3/2009 | Steffensmeier et al. ...... 313/504 |
| 2002/0003402 A1 * | 1/2002 | Yamaguchi et al. .......... 313/504 |
| 2003/0082401 A1 * | 5/2003 | Zheng et al. .................. 428/690 |
| 2003/0143339 A1 | 7/2003 | Kobayashi |
| 2004/0012330 A1 * | 1/2004 | Ohshita et al. ............... 313/504 |
| 2004/0108808 A1 | 6/2004 | Kumagai et al. |
| 2004/0189194 A1 | 9/2004 | Kihara et al. |
| 2004/0263441 A1 * | 12/2004 | Tanaka et al. ................ 345/76 |
| 2004/0263443 A1 * | 12/2004 | Shirasaki ..................... 345/76 |
| 2005/0116240 A1 * | 6/2005 | Kim et al. ..................... 257/88 |
| 2005/0153114 A1 | 7/2005 | Gupta et al. |
| 2005/0200276 A1 * | 9/2005 | Uhlig et al. .................. 313/506 |
| 2005/0285509 A1 * | 12/2005 | Funamoto et al. ............ 313/504 |
| 2007/0241690 A1 * | 10/2007 | Smith ......................... 315/169.2 |

\* cited by examiner (a)  PRIOR ART (b)  PRIOR ART (c)  PRIOR ART (d)  PRIOR ART

PRIOR ART

PRIOR ART

METHOD OF PRODUCING A DISPLAY DEVICE

CROSS-REFERENCE TO RELATED APPLICATION

This application is a National Stage of International Application No. PCT/JP2006/308797 filed on Apr. 20, 2006, claiming priority based on Japanese Patent Application No. 2005-126883, filed Apr. 25, 2005, which claims the benefit of U.S. Provisional Application Ser. No 60/677,415, filed May 4, 2005, under the provision of 35 U.S.C. Section 111(b), pursuant to 35 U.S.C. Section 119(e) (1), the contents of all of which are incorporated herein by reference in their entirety.

TECHNICAL FIELD

The present invention relates to a method for producing an organic electroluminescent display device, an organic electroluminescent display device produced by the method and an electronic equipment using the display device. More specifically, the present invention relates to a method for producing an organic electroluminescent display device comprising forming an organic electroluminescent layer on each of multiple electrodes to produce the display device composed of corresponding multiple organic electroluminescent elements, wherein a substrate having portions between the electrodes and/or the surface of the electrodes which have been subjected to water-repellent treatment is used and the organic electroluminescent layer (light-emitting layer) is formed on the electrodes, and further relates to an organic electroluminescent display device produced by the method and an electronic equipment using the display device.

BACKGROUND ART

An organic electroluminescent device has been recently attracting attention as promising to realize a display device having an extremely small thickness, a light weight, a small size, a low power consumption and the like in the future. The organic electroluminescent device is expected to be widely used in the future. In particular, the combination of the device with a low-temperature polycrystalline silicon thin film transistor realizes further reductions in thickness, weight and size. An organic electroluminescent device driven by a low-temperature polycrystalline silicon thin film transistor can be one of the ideal devices (T. Shimoda, M. Kimura, et al., Proc. Asia Display 98, 217 (1998), M. Kimura, et al., IEEE Trans. Elec. Dev., to be published).

Examples of a method of producing an organic electroluminescent element include a vacuum process and a liquid-phase process. In general, a vacuum process such as a deposition method or a sputtering method is employed for producing a low-molecular organic electroluminescent element (in the present Specification, each pixel constituting a display panel is referred to as an organic electroluminescent element).

On the other hand, letterpress printing, intaglio printing, stencil printing, or a non-plate printing method is employed for production of a high-molecular organic electroluminescent element. A liquid-phase process such as a spin coating method, a squeegee application method, an ink-jet method or a nozzle-coating method is used in the non-plate printing method. In particular, the ink-jet method where film formation and patterning for applying colors separately can be simultaneously performed is said to be advantageous.

In ink-jet method, which is a method of forming as a pattern thin films different from each other in properties on a single substrate through coating, it is necessary to provide an insulating layer as an element-separating structure between pixels, in order to prevent problems that thin film materials get mixed with each other on the substrate or that a discharged liquid material flows out into a wrong pixel adjacent to the target area. (See JP-A-2002-305077.)

The term "insulating layer" as used herein refers to a structure interposed between pixels for separating organic electroluminescent elements of respective pixels.

However, a method of producing an organic electroluminescent device including forming the insulating layer involves drawbacks as described below.

FIG. 1 shows a sectional view of a conventional organic electroluminescent device including as insulating layers a first insulating layer and a second insulating layer as described in Proc. Asia Display 98, 217 (1998), IEEE Trans. Elec. Dev., and FIGS. 2(a) to 2(d) show a method (steps) of producing the device.

The organic electroluminescent device of this conventional example includes a first insulating layer 1 and a second insulating layer 2 on an anode 3. After forming the first insulating layer 1 and the second insulating layer 2, organic electroluminescent layers 4 are formed from compounds different depending on the color which each of the layers targets by means of an ink-jet process or the like. Then, a film of cathode 5 is formed on the layers 4, whereby an organic electroluminescent device is completed.

The second insulating layer 2 is controlled to be liquid-repellent through an appropriate surface treatment, whereby in applying the organic electroluminescent layer 4 to each pixel, colors can be prevented from mixing with each other.

However, controlling the second insulating layer 2 to be liquid-repellent, which results in generation of thinner regions 6 of an organic electroluminescent layer 4 around edges of the second insulating layer 2, leads to difficulty in uniform film formation.

When the anode 3 and the cathode 5 are present in this region 6, short circuit occurs, with the result that a leakage current remarkably increases. In view of the foregoing, the first insulating layer 1 is provided so that no short circuit occurs around the edge of the second insulating layer 2.

In the process shown in FIG. 2, the anode 3 is formed of ITO, the first insulating layer 1 is formed of $SiO_2$ through plasma enhanced chemical vapor deposition (PECVD) of ethyl silicate (tetraethoxy silane: TEOS), and the second insulating layer 2 is formed of polyimide by means of a spin coating method.

In this conventional example, the first insulating layer 1 is formed on the anode 3 formed of ITO (FIG. 2(a)). Then, patterning is performed in such a manner that openings are provided at positions on the anode 3 which are predetermined to emit light (FIG. 2(b)). Next, the second insulating layer 2 is formed by means of a liquid-phase process (FIG. 2(c)). Patterning is performed in such a manner that openings are provided at positions on the anode 3 which are predetermined to emit light (FIG. 2(d)).

As can be seen from FIG. 2, since a film having a considerably large thickness is used as the first insulating layer 1, the part of the second insulating layer 2 on the opening portion of the first insulating layer 1 is much thicker than other parts.

Therefore, in etching the second insulating layer 2, setting the etching time in accordance with a thin portion may cause an etching residue to generate at a thick portion. Reference numeral 7 in FIG. 2 (d) denotes an etching residue thus produced in an opening portion. In addition, setting an etching time in accordance with a thick portion may cause a large side-etched portion to generate at a thin portion.

In addition, since the first insulating layer 1 is formed by means of a vacuum process, the surface of the first insulating layer 1 is not flat. That is, undulations are present on the surface according to the presence or absence of the anode 3 underneath. Furthermore, nonuniformity in thickness of the second insulating layer 2 is present in correspondence with the undulations of the surface. The etching residue of the second insulating layer 2 may generate as a result of the nonuniformity in thickness. Reference numeral 8 in FIG. 2(d) denotes an etching residue thus produced on an uneven surface. When attempts are made to completely remove the etching residue 8 from the uneven surface, for example, a large side etch may generate at any other site. Thus, reduction in performance of an organic electroluminescent device which is a result of etching residue or unevenness of the surface is a big problem.

In addition, in order to improve the light-emitting property of an organic electroluminescent (EL) element, a work function or the like, in addition to the cleanliness and irregularities of the surface on which an organic electroluminescence compound is formed into a film, must be controlled to an optimum value in accordance with the organic electroluminescence compound (JP 2004-63210 A). Accordingly, procedures such as a step of liquid-washing the surface onto which the organic electroluminescence compound is to be applied or a step of removing an impurity such as an organic substance adhering to a substrate surface through an oxygen plasma treatment are required. However, it is extremely difficult to completely wash a substrate surface on which the above-described insulating layer is present or to uniformly perform a surface treatment (JP 2001-126867 A)

The reason why an organic electroluminescent device must be produced still with an insulating layer in spite of such disadvantages involved in the formation of an insulating layer is that, since a conventional organic electroluminescent device using a polymer organic electroluminescent compound basically has a laminate structure composed of an anode/a hole-injecting layer/an organic electroluminescent layer/a cathode, such an organic electroluminescent device cannot be put into practical use unless produced so as to include a hole-injecting layer interposed between an anode and an organic electroluminescent layer (JP 2000-516760 A).

Any kind of compound can be used for the hole-injecting layer as far as the compound has a function of efficiently injecting a hole from the anode to the organic electroluminescence layer. A water-soluble conductive polymer (BAYTRON (registered trademark) manufactured by Starck Vitec. Co.) has been conventionally widely used. One requirement of a compound to be used for a hole-injecting layer is that the hole-injecting layer must not be dissolved in an organic electroluminescent compound which is to be applied onto the hole-injecting layer.

Moreover, since an organic electroluminescent compound is dissolved in an organic solvent and then applied, it is preferable that a hole-injecting layer be insoluble in an organic solvent (that is, water-soluble).

In other words, in a process where an organic electroluminescent device is produced by means of an organic electroluminescent compound requiring a hole-injecting layer, it is necessary that a water-soluble hole-injecting layer be first applied onto the surface of an anode. When the surface of the anode is water-repellent, the hole-injecting layer is repelled and cannot be applied.

Accordingly, it is necessary to control apart on the surface of an electrode on which a hole-injecting layer is formed to be hydrophilic and it is also necessary to form a pattern such that a water-repellent insulating layer like a dike is formed on the part between electrodes on which part a hole-injecting layer is not to be formed. Therefore, formation of an insulating layer is conventionally indispensable.

DISCLOSURE OF THE INVENTION

Therefore, an object of the present invention is to provide a method for producing a stable and high-performance organic electroluminescent device, without formation of an insulating layer that impairs the cleanliness and smoothness of an element surface which are necessary for improving the properties of the organic electroluminescent device or with an insulating layer formed much thinner than conventional one.

The inventors of the present invention have made extensive studies to achieve the above object. As a result, they have found that it is possible to apply a polymer organic electroluminescent compound without formation of an insulating layer that has been conventionally necessary in applying the compound to form a film or with an insulating layer formed to have a much smaller thickness than conventional one and found a production method of an organic electroluminescent device which can avoid reduction in performance of the device due to an insulating layer.

That is, the inventors have found that, imparting water repellency to the surface of a substrate on which a layer containing an organic electroluminescent compound is to be applied by forming a water-repellent thin film on the substrate surface enables formation of a film through patterning organic electroluminescent compound layer, even without forming an insulating layer or with a very thin insulating layer, and based on the finding, further found out a method of producing an organic electroluminescent device having good organic electroluminescent properties, to thereby achieve the invention.

The present invention consists of the following items.
1. A method of producing an organic electroluminescent device comprising applying a composition containing an organic electroluminescent compound onto multiple electrodes to form an organic electroluminescent layer on each of the electrodes, wherein the substrate on which the composition is applied is a substrate with the portions between electrodes and/or the surface of the electrodes having been subjected to water-repellent treatment.
2. The method of producing an organic electroluminescent device according to 1 above, wherein the water-repellent treatment includes formation of a water-repellent thin film.
3. The method of producing an organic electroluminescent device according to 2 above, wherein the water-repellent thin film has a thickness of 0.2 to 30 nm.
4. The method of producing an organic electroluminescent device according to 2 above, wherein an insulating layer having a thickness of 0 to 3000 nm as measured from the substrate surface is provided around each of multiple electrodes, at an angle of 0 to 80 degrees as observed from the top surface of the electrodes.
5. The method of producing an organic electroluminescent device according to 4 above, wherein around the multiple electrodes on which the water-repellent thin film is formed, an insulating layer having a thickness of 0 to 500 nm as measured from the substrate surface and having an angle of 0 to 30 degrees as observed from the top surface of the electrodes is provided.
6. The method of producing an organic electroluminescent device according to 1 or 2 above, wherein the organic electroluminescent layer is a layer containing a polymer organic electroluminescent compound.
7. The method of producing an organic electroluminescent device according to 2 above, wherein the process of forming the water-repellent thin film is a treatment of forming a fluoride film on the surface of the substrate.
8. The method of producing an organic electroluminescent device according to 7 above, wherein the fluoride film is formed through a plasma treatment using a fluorocarbon-based compound as a reactant gas.
9. The method of producing an organic electroluminescent device according to 2 above, wherein the surface roughness of the water-repellent thin film is 1 nm or less in terms of Ra value.
10. The method of producing an organic electroluminescent device according to 2 above, wherein the height of the surface protrusion of the water-repellent thin film is 10 nm or less.
11. The method of producing an organic electroluminescent device according to 2 above, wherein the water-repellent thin film is formed as an organic thin film by high frequency (RF) plasma method using a gaseous organic compound.
12. The method of producing an organic electroluminescent device according to 2 above, wherein after treating the anode (surface) with high frequency plasma, a thin film formed is subjected to optimization treatment to thereby become a water-repellent thin film.
13. The method of producing an organic electroluminescent device according to 2 above, wherein after treating the anode (surface) with high frequency plasma, a thin film is formed through high frequency (RF) plasma method using a gaseous organic compound and then the film is subjected to optimization treatment to thereby become a water-repellent thin film.
14. The method of producing an organic electroluminescent device according to 2 above, wherein the process of forming the water-repellent thin film involves treatment of the substrate surface by sputtering to thereby form a thin film of $SiO_2$.
15. The method of producing an organic electroluminescent device according to 12 or 13 above, wherein the optimization treatment is washing treatment using a solvent.
16. The method of producing an organic electroluminescent device according to 12 or 13 above, wherein the high frequency (RF) plasma method is conducted in a gas containing one or more kinds selected from a group consisting of oxygen, argon and fluorocarbon.
17. The method of producing an organic electroluminescent device according to 2 above, wherein the contact angle of water with respect to the water-repellent thin film is 30° or more.
18. The method of producing an organic electroluminescent device according to 1 or 2 above, wherein the composition containing the organic electroluminescent compound is applied onto the multiple electrodes by means of letterpress printing, intaglio printing, stencil printing or a non-plate printing method.
19. The method of producing an organic electroluminescent device according to 18 above, wherein the composition containing the organic electroluminescent compound is applied by non-plate printing through ink ejection process.
20. The method of producing an organic electroluminescent device according to 18 above, wherein the composition containing the organic electroluminescent compound is applied by a nozzle coating method.
21. The method of producing an organic electroluminescent device according to 1 or 2 above, wherein the organic electroluminescent compound is a phosphorescent polymer compound.
22. The method of producing an organic electroluminescent device according to 1 or 2 above, wherein the organic electroluminescent compound is a fluorescent polymer compound or a non-conjugated phosphorescent polymer.
23. An organic electroluminescent device produced by the method described in any one of 1 to 22 above.
24. A substrate for an organic electroluminescent device, which is produced by a process included in the method described in any one of 1 to 22 above.
25. An electronic instrument including an organic electroluminescent device described in 23 above.
26. The electronic instrument according to 25 above, which is a surface emission light source, a backlight for a device, an apparatus, a lighting apparatus or an interior or exterior accessory.

According to the production method of the present invention, an organic electroluminescent compound can be applied even in a state that no insulating layer is formed layer on the surface of an anode substrate or that the insulating layer formed on the substrate surface is extremely thin, so that a stable and high-performance organic electroluminescent device can be produced.

Figure 1:
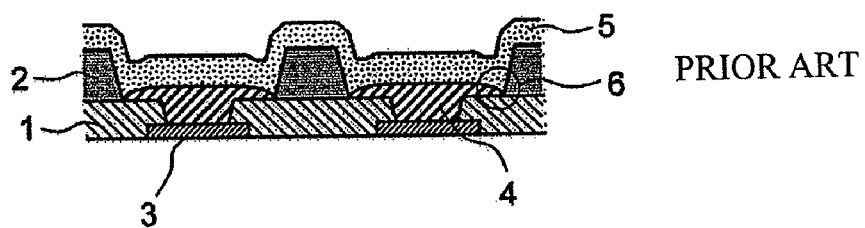
FIG. 1 is a sectional view of a conventional organic electroluminescent device having a first insulating layer and a second insulating layer.
Figure 2:
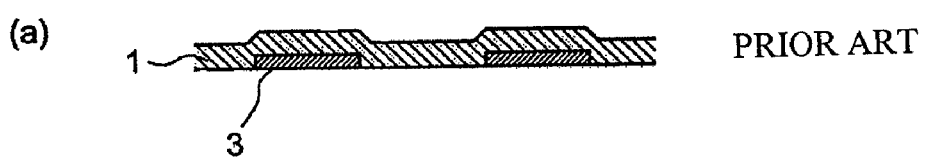
FIGS. 2(a) to 2(d) show a method (process) of producing the organic electroluminescent device shown in FIG. 1.
Figure 2:
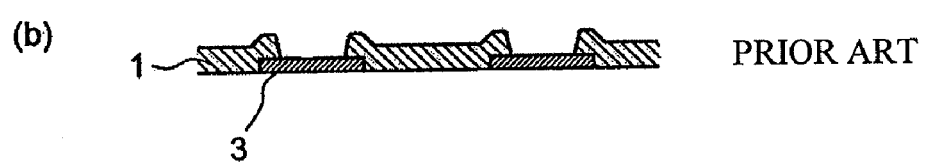
Figure 2:
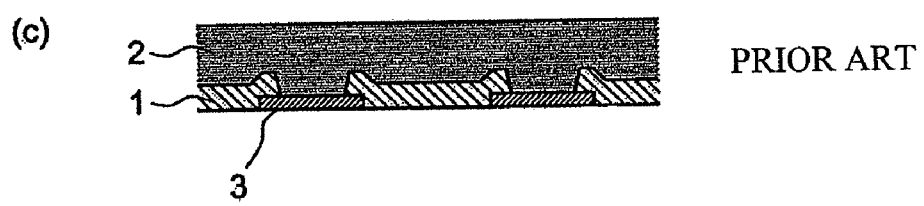
Figure 2:
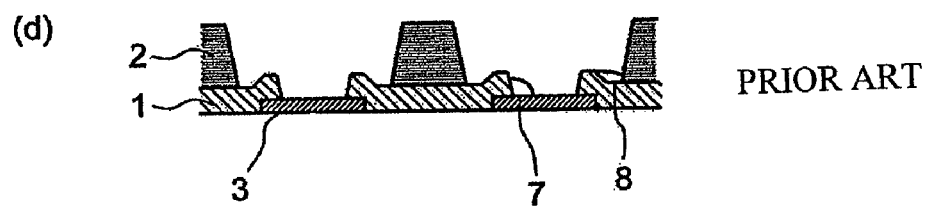

DESCRIPTION OF SYMBOLS 1 first insulation layer
2 second insulating layer
3 anode
4 light-emitting layer
5 cathode
6 thin region of a light-emitting layer
7 etching residue of an opening
8 etching residue of a surface undulation
9 hole-injecting layer
10a red organic electroluminescent compound
10b green organic electroluminescent compound
10c blue organic electroluminescent compound
11 ink-jet applying device head portion
12 application solution
13 ITO interval
14 insulating layer
B embodiment of organic electroluminescent device according to the present invention
C organic electroluminescent device according to the conventional method
S glass substrate.

BEST MODE FOR CARRYING OUT THE INVENTION

Hereinafter, the present invention will be described in more detail with reference to drawings (FIGS. 3 to 20) attached hereto.

The method of producing an organic electroluminescent device according to the present invention is a method where an organic electroluminescent device is produced by applying an organic electroluminescent compound onto a substrate having a surface adjusted to be water-repellent through formation of a water-repellent thin film on the surface or the like, to thereby form a film having a predetermined pattern shape, through preferably, a nozzle coating process.

<<Constitution of Organic Electroluminescent Device>>

First, the constitution of an organic electroluminescent device will be described. As the first step, a film (3) is formed from an anode material on the surface of a flat substrate (S in FIG. 8). Here, as an example of the substrate used herein, a glass substrate can be mentioned, however the substrate is not limited thereto. Any insulating substrate can be used as far as the substrate is transparent with respect to the emission wavelength of the emitting material. Alternatively, the substrate may be a substrate with a thin film transistor (TFT). A known flexible material such as a transparent plastic such as polyethylene terephthalate (PET) or polycarbonate can also be used.

<<Anode>>

As the film to be formed as the anode on the substrate, a conductive and optically transparent layer such as ITO (indium tin oxide) is the most commonly used. When organic light emission is observed through the substrate, the optical transparency of the anode and the substrate is indispensable. However, in an application where organic light emission is top emission, that is, the organic light emission is observed through an upper electrode, the transparency of the anode is not necessary. In this case, an appropriate and arbitrarily selected material such as a metal or metallic compound having a work function of 4.1 eV or more can be used for the anode.

For example, gold, nickel, manganese, iridium, molybdenum, palladium, platinum, and the like can be used in combination, or each of them can be used alone. The anode can be selected from the group consisting of the oxides, nitrides, selenides, and sulfides of a metal. In addition, any one of the above metals formed into a thin film having a thickness of 1 to 3 nm on the surface of ITO having good optical transparency so as not to impair the optical transparency can also be used as the anode. Examples of an available method of forming any one of the metals into a film on the surface of an anode material include an electron beam deposition method, a sputtering method, a chemical reaction method, a coating method, and a vacuum deposition method. The thickness of the anode is preferably 2 to 300 nm.

<<Water-Repellent Layer>>

In the present invention, a substrate having been subjected to water-repellent treatment so that the portion between the electrodes and/or the surface of the electrode may be water-repellent is used. By subjecting the portion between electrodes to water-repellent treatment, no insulating layer like a dike is necessary and further, by subjecting the surface of the electrodes to water-repellent treatment, no hole-injecting layer is required. A method using a substrate with either of the portion between the electrodes or the surface of the electrode having been subjected to water-repellent treatment is included in the scope of the present invention, however it is preferable that water-repellent treatment be given to both of the portion between the electrodes and the surface of the electrodes.

Description about water-repellent treatment will be made by referring to an example using an ITO as the anode.

An ITO film formed on the substrate is formed through patterning into electrodes each having a predetermined shape by means of a photolithography technique. Thus, multiple ITO electrodes each having a shape onto which an organic electroluminescent compound of each color is to be applied are formed on the surface of the substrate.

Next, surface treatment for giving water repellency to the surface of the substrate on which ITO has been formed is conducted. Typically, a water-repellent thin film (hereinafter, sometimes referred to as "water-repellent layer") is formed. Examples of methods for forming a water-repellent thin film can be roughly classified into wet-process methods where the material is dissolved in a solvent and applied onto the substrate and dry-process methods such as high-frequency plasma treatment, sputtering treatment, corona treatment, UV ozone irradiation treatment, vacuum deposition method, laser transcription method and oxygen plasma treatment. In either case, a single method which is widely used may be employed or two or more kinds of them can be employed in combination.

The water-repellent thin film thus formed has a thickness of preferably 0.2 to 30 nm, more preferably 0.2 to 10 nm. The composition and chemical structure of an organic substance forming the thin film are not particularly limited. However, the organic substance after formed into the thin film is required to have an appropriate water repellency which enables provision of an appropriate thickness and an appropriate coating shape to a light-emitting compound to be laminated thereon. Furthermore, examples of the properties of the organic substance include a property of not being dissolved by coating of the light-emitting compound to be laminated thereon, a property of not being scattered or diffused due to physical impact at the time of the coating step, good adhesiveness with the light-emitting compound and an appropriate ionization potential. Any kind of compound imparting those properties to the anode substrate can be used.

As an example of a compound having good adhesiveness with the light-emitting compound, a compound which has a partial structure having a strong interaction with the light-emitting compound is preferred. The compound desirably contains in an appropriate manner, as the partial structure, especially an aromatic ring, alkyl chain, fluorine or the like where a hydrophobic interaction can be expected. The compound does not necessarily have to be an organic substance, and inorganic substances such as a metal fluoride and a metal oxide may be used. Moreover, a method where a compound containing silicon such as $SiO_2$ is sputtered on a metal surface to thereby form a thin film is also effective.

In addition, the appropriate ionization potential of the water-repellent thin film, which depends on the kind of an organic electroluminescent compound to be used, is preferably 4.5 to 6.0 eV, more preferably 4.8 to 5.5 eV.

In a case where the water-repellent thin film is formed by a wet process, optimization treatment is performed after forming a film by a spin coating method, a casting method, a micro gravure coating method, a gravure coating method, a bar coating method, a roller coating method, a wire-bar coating method, a dip coating method, a spray coating method, a screen printing method, a flexo printing method, an offset printing method and an ink-jet printing method. That is, the film can be obtained by washing the surface with a solvent capable of dissolving components of the light-emitting compound to improve or modify properties of the film. Washing step with a solvent may be conducted by a method such as a spin coating method, an ink-jet method and a dipping method, similarly as in the coating step of the water-repellent thin film. In other words, the components which may disperse or diffuse during the step of newly laminating a light-emitting compound on the water-repellent thin film can be removed in advance by washing the surface with a solvent. Furthermore, after the water-repellent thin film completely covers the dents and protrusions on the substrate surface, controlling the frequency of washing the film surface with a solvent enables not only removal of loose components present on the film surface but also achievement of a water-repellent thin film having a surface smoothness. Also, by treating the film surface with a solvent, the surface energy can be controlled. On the basis of the status immediately after the film is formed, a water contact angle changes from 5 to 140° by conducting washing treatment. Therefore, the surface energy can be adjusted depending on polarity of the light-emitting compound to be laminated. Besides, the similar effects can be obtained by conducting annealing treatment on the thin film under various atmospheres, ion implantation, radiation treatment such as UV radiation and UV ozone radiation or additional plasma treatment with oxygen, nitrogen or hydrogen.

A compound to be used for the above-mentioned wet process for forming the film is not particularly limited so long as the compound has good adhesiveness to both the anode surface and the light emitting compound contained in a layer formed thereon. However, it is preferable to employ a conventional anode buffer which has been generally used. Examples of the compound include an electrically conductive polymer such as PEDOT (a mixture of poly(3,4)-ethylenedioxythiophene and polystyrenesulfonic acid) and PANI (a mixture of polyaniline and polystyrenesulfonic acid). Further, an organic solvent such as toluene and isopropyl alcohol may be added to the electrically conductive polymers. The electrically conductive polymer may contain a third component such as a surfactant. An example of the surfactant is a surfactant containing a group selected from a group consisting of an alkyl group, alkyl aryl group, fluoro alkyl group, alkyl siloxane group, sulphate, sulfonate, carboxylate, amide, a betaine structure and quaternary ammonium group. A nonionic fluoride surfactant may also be used.

A water-repellent thin film can be also formed by a dry process method such as high-frequency (RF) plasma treatment. In particular, according to a radio-frequency plasma treatment involving applying glow discharge to an organic substance gas to thereby deposit the organic substance gas as a solid on a solid layer, a film excellent in adhesiveness and having high durability can be obtained. For example, a thin film composed of fluorocarbon can be formed on a substrate by: causing gaseous fluorocarbon to perform glow discharge in RF plasma; and bringing the substrate into contact with the fluorocarbon. A fluorocarbon thin film can be formed by subjecting gaseous fluorocarbon to a plasma treatment in an RF device house. The gaseous fluorocarbon can be selected from the group consisting of $CF_4$, $C_3F_8$, $C_4F_{10}$, $CHF_3$, $C_2F_4$ and $C_4F_8$.

Plasma can be generated by applying (outputting) a radio-frequency (RF) voltage at an appropriate power level in a device house. A reaction temperature varies depending on parameters such as an output, a gas flow rate and a treatment time. A film thickness is preferably adjusted in an appropriate manner with good reproducibility by placing a temperature adjusting function in the device house. The contact angle of the surface of the anode substrate on which a thin film thus produced, especially a thin film containing a fluoride is formed, can be controlled to be in the range of 30° to 170°. The contact angle is preferably 40° to 150°, or more preferably 60° to 120° so that the subsequent step of applying an organic electroluminescent compound can be performed well. Thus, the anode substrate ready to be coated with organic electroluminescent compound of each color is produced.

When forming the water-repellent thin film by a dry-process method where high frequency plasma treatment is used, the surface of the anode can be etched by controlling the conditions for plasma generation. That is, by the high frequency plasma treatment, smoothing of the anode surface by the effect of etching the anode surface can be performed at the same time with the film formation. As described above, for example, a silicon compound can be formed into a thin film by sputtering.

The thus obtained thin film can be optimized similarly as the water-repellent thin film obtained by any one of the above-mentioned coating methods. That is, the film properties can be improved or modified by a further surface treatment, to thereby be more appropriate. Specifically, by washing the film surface with a solvent, the surface smoothness and the film thickness can be adjusted to an appropriate range and durability of the film can be enhanced. Here, the term "smoothness of the film" means the state including that the surface roughness (Ra value) is 1 nm or less and that the height of the protrusions present on the surface of the film is 10 nm or less. An "appropriate film thickness" means a thickness range of 0.2 to 30 nm. Similarly, the surface energy of the film can also be adjusted. Further, the similar effects can be obtained by annealing treatment under various atmospheres; ion implantation, radiation treatment such as UV radiation and UV ozone radiation; or an additional plasma treatment with oxygen, nitrogen or hydrogen.

Before forming the water-repellent thin film, by conducting pretreatment on the anode surface on which the water-repellent thin film is to be formed, properties of the water-repellent thin film (adhesiveness to an anode substrate, finished surface smoothness, alleviation of the hole injection barrier, etc.) may be improved, when necessary. Examples of pretreatment methods include radio frequency plasma treatment, sputtering treatment, corona treatment, UV ozone treatment and oxygen plasma treatment.

<<Insulating Layer>>

In the present invention, formation of an insulating layer (the term "insulating layer" means an insulating layer other than the water-repellent thin film formed by the above water-repellent treatment) between electrodes is unnecessary. However, it is possible to provide an insulating layer. As described above, an insulating layer is provided between pixels in order to isolate the electroluminescent elements for each pixel. In the electroluminescent device of the present invention, the thickness of an insulating layer is much smaller than that in a conventional device, for the purpose of keeping the cleanness of the substrate. Specifically, the thickness measured from the substrate surface is preferably 0 to 500 nm, particularly preferably 0 to 200 nm. The thickness of 0 nm means absence of an insulating layer.

As shown in FIG. 9(a), The gentler the incline of the insulating layer from the edge down to the anode, the more preferable. In this case, the preferable angle is from 0 to 30 degrees, and particularly preferred is from 2 to 10 degrees. Here, the angle 0 degree means a case where the insulating layers are in contact with ITO to the same height, as shown in FIG. 9(b), to thereby completely cover the side surface of the ITO. As shown in FIG. 9(c), the intervals between the ITO stripes may be filled with insulating layer en suite.

Thus, it is preferable that, in the electroluminescent device of the present invention, an insulating layer which is much thinner than an insulating layer in a conventional electroluminescent device be employed. In conventional technique, without an insulating layer having a sufficient height, coating of light emitting layer cannot be performed. On the other hand, in the present invention, by providing a water-repellent thin film on the substrate surface, coating to form a light emitting layer can be favorably conducted.

Examples of compound for forming an insulating layer include $C_nF_n$ and $SiO_2$-<

<Step of Forming an Organic Electroluminescent Compound Layer>>

Description will be given of a step of forming an organic electroluminescent compound on the anode substrate. Examples of an organic electroluminescent compound used for forming an organic electroluminescent layer of the organic electroluminescent device of the present invention include a low-molecular light-emitting compound and a high-molecular light-emitting compound described in Hiroshi Omori: Applied Phys., vol 70, twelfth edition, p. 1419-1425 (2001). Of those, a high-molecular light-emitting compound, which enables simplification of a process for producing a device, is preferable, and a phosphorescent compound is preferred for its high luminous efficiency. Therefore, in particular, a phosphorescent polymer compound is more preferred.

The structure of the phosphorescent polymer compound to be used as a light-emitting layer of the organic electroluminescent element of the present invention is not particularly limited as long as the compound is a polymer compound emitting phosphorescence at room temperature. Specific examples of a polymer structure include polymer structures each using any one of the conjugate polymer structures such as poly(p-phenylenes), poly(p-phenylenevinylenes), polyfluorenes, polythiophenes, polyanilines, polypyrroles and polypyridines as a skeleton and having a phosphorescent site (a representative example thereof includes a monovalent or divalent group of a transition metal complex or rare earth metal complex to be described later) bonded to the skeleton. In each of those polymer structures, the phosphorescent site may be incorporated into a main chain or a side chain.

Other examples of the polymer structure of the phosphorescent polymer compound include polymer structures each using any one of the non-conjugate polymer structures such as polyvinyl carbazole, polysilanes and polytriphenylamines as a skeleton and having a phosphorescent site bonded to the skeleton. In each of those polymer structures, the phosphorescent site may be incorporated into a main chain or a side chain.

Still other examples of the polymer structure of the phosphorescent polymer compound include dendrimers each having a phosphorescent site. In this case, the phosphorescent site may be incorporated into any one of the central nucleus, branched portion and terminal portion of the dendrimer.

In the above polymer structure, phosphorescence is emitted from the phosphorescent site bonded to a conjugate or non-conjugate skeleton. Alternatively, the conjugate or non-conjugate skeleton itself may emit phosphorescence.

A polymer using a non-conjugate polymer structure as a skeleton and having a phosphorescent site bonded to the skeleton (hereinafter referred to as non-conjugate phosphorescent polymer) is a preferable phosphorescent polymer compound to be used for the organic electroluminescent element of the present invention, in that there is a high degree of freedom in material design, that phosphorescence can be relatively easily obtained, that the polymer can be easily synthesized and that the polymer has so high solubility in a solvent that a coating solution can be easily prepared.

The non-conjugate phosphorescent polymer is constituted by a phosphorescent site and a carrier-transporting site. Representative examples of polymer structures are classified into the following (1) to (4) by the bonding state of the phosphorescent site and the carrier-transporting site: (1) a structure where both the phosphorescent site and the carrier-transporting site are present in the main chain of the polymer; (2) a structure where the phosphorescent site is present at a side chain of the polymer and the carrier-transporting site is present in the main chain of the polymer; (3) a structure where the phosphorescent site is present in the main chain of the polymer and the carrier-transporting site is present at a side chain of the polymer; and (4) a structure where both the phosphorescent site and the carrier-transporting site are present at side chains of the polymer.

In addition, the above polymer structure may have a crosslinking structure. Alternatively, the structure may be a single polymer (homopolymer) structure in which each of a hole-transporting compound, an electron-transporting compound, and a light-emitting compound is independently present without bonding to one another or the polymer may be a polymer obtained by polymerizing two kinds of compounds. Furthermore, a polymerized compound may be one or more selected from three compounds: a hole-transporting compound, an electron-transporting compound and a light-emitting compound. The other compounds may be low-molecular compounds.

The above non-conjugate phosphorescent polymer may have two or more kinds of phosphorescent sites (each of which may be present in the main chain or at a side chain). In addition, the polymer may have two or more kinds of carrier-transporting sites (each of which may be present in the main chain or at a side chain, or the sites does not have to be bonded thereto).

The weight average molecular weight of the above non-conjugate phosphorescent polymer is preferably 1,000 to 1,000,000, more preferably 10,000 to 500,000.

A monovalent group of a compound that emits phosphorescence at room temperature or a polyvalent group having two or more valences of such a compound can be used as the above phosphorescent site. A monovalent or divalent group of a transition metal complex or rare earth metal complex is preferable. Examples of the transition metals used in the transition metal complex include: the first series of transition elements in the periodic table, that is, from Sc with an atomic number of 21 to Zn with an atomic number of 30; the second series of transition elements in the periodic table, that is, from Y with an atomic number of 39 to Cd with an atomic number of 48; and the third series of transition elements in the periodic table, that is, from Hf with an atomic number of 72 to Hg with an atomic number of 80. In addition, examples of the rare earth metals used in the rare earth metal complex include the lanthanoid series of elements in the periodic table, that is, from La with an atomic number of 57 to Lu with an atomic number of 71.

Examples of a ligand that can be used for the transition metal complex and rare earth metal complex include ligands described in G. Wilkinson (Ed.), Comprehensive Coordination Chemistry (Plenum Press, 1987) and Akio Yamamoto "Yuki Kinzoku Kagaku-Kiso to Oyo (Organic Metal Chemistry-Basis and Application)" (Shokabo, 1982). Of those, a halogen ligand, a nitrogen-containing heterocyclic ligand (such as a phenylpyridine-based ligand, a benzoquinoline-based ligand, a quinolinol-based ligand, a bipyridyl-based ligand, a terpyridine-based ligand, or a phenanthroline-based ligand), a diketone ligand (such as an acetylacetone ligand or a dipivaloylmethane ligand), a carboxylic ligand (such as an acetic ligand), a phosphorus ligand (such as a triphenylphosphine-based ligand or a phosphite ester-based ligand), a carbon monoxide ligand, an isonitrile ligand, and a cyano ligand are preferable. One metal complex may contain multiple ligands. In addition, a binuclear complex or a multinuclear complex can be used as a metal complex.

As the carrier-transporting site, a monovalent group or polyvalent group having two or more valences, which has either one of hole-transporting property and electron-transporting property or which has a bipolar property provided with both of hole and electron transporting functions, can be used. Examples of a carrier-transporting site having hole-transporting property include monovalent or divalent groups of carbazole, triphenylamine, and N,N'-diphenyl-N,N'-(3-methylphenyl)-1,1'-biphenyl-4,4'diamin e (TPD). In addition, examples of a carrier-transporting site having electron-transporting property include: monovalent or divalent groups of a quinolinol derivative metal complex (such as trisaluminumquinolinol ($Alq_3$)), an oxadiazole derivative, a triazole derivative, an imidazole derivative, and a triazine derivative; and boron-based compounds. In addition, examples of a carrier-transporting site having bipolar property include a monovalent or divalent group of 4,4'-N,N'-dicarbazole-biphenyl (CBP).

The light-emitting layer of the organic electroluminescent element of the present invention can be formed only of the phosphorescent polymer compound or of conjugate polymer described above. Alternatively, for the purpose of supplementing the carrier-transporting property of the phosphorescent polymer compound or conjugate polymer, the light-emitting layer can be formed of a composition prepared by mixing the phosphorescent polymer compound or conjugate polymer with other carrier-transporting compounds. That is, in a case where the phosphorescent polymer compound has hole-transporting property, an electron-transporting compound can be mixed. On the other hand, in a case where the phosphorescent polymer compound has electron-transporting property, a hole-transporting compound can be mixed. Here, the carrier-transporting compound to be mixed with the phosphorescent polymer compound may be either a low-molecular compound or a polymer compound.

Examples of a low-molecular hole-transporting compound that can be mixed with the phosphorescent polymer compound include known hole-transporting compounds typified by triphenylamine derivatives such as: N,N'-diphenyl-N,N'-(3-methylphenyl)-1,1'-biphenyl-4,4'diamin e (TPD); 4,4'-bis [N-(1-naphthyl)-N-phenylamino]biphenyl (α-NPD); and 4,4',4"-tris(3-methylphenylphenylamino)triphenylamine (m-MTDATA). In addition, examples of a polymer hole-transporting compound that can be mixed with the phosphorescent polymer compound include polyvinyl carbazole- and triphenylamine-based low-molecular compounds polymerized by introducing polymerizable functional groups such as a polymer compound having a triphenylamine skeleton disclosed in JP 08-157575 A.

On the other hand, examples of a low-molecular electron-transporting compound that can be mixed with the phosphorescent polymer compound include a quinolinol derivative metal complex (such as trisaluminumquinolinol ($Alq_3$)), an oxadiazole derivative, a triazole derivative, an imidazole derivative, and a triazine derivative. In addition, examples of a polymer electron-transporting compound that can be mixed with the phosphorescent polymer compound include the above low-molecular electron-transporting compounds polymerized by introducing polymerizable functional groups such as polyPBD disclosed in JP 10-1665 A.

In addition, for the purpose of improving the physical properties and the like of a film formed of the phosphorescent polymer compound, a polymer compound not directly involved in the light-emitting property of the phosphorescent polymer compound is mixed with the phosphorescent polymer compound to prepare a composition, and the composition can be used as a light-emitting compound. For example, polymethyl methacrylate (PMMA) or polycarbonate can be mixed for imparting flexibility to a film to be obtained.

The thickness of the light-emitting layer is preferably 1 nm to 1 µm, more preferably 5 nm to 300 nm, still more preferably 10 nm to 100 nm.

In the organic electroluminescent element of the present invention, the electroluminescent layer may consist only of the above light-emitting layer or may consist of combination of a hole-transporting layer and an electron transporting layer.

Examples of a hole-transporting compound constituting the hole-transporting layer include known low-molecular hole-transporting compounds including: triphenylamine derivatives such as N,N'-dimethyl-N,N'-(3-methylphenyl)-1,1'-biphenyl-4,4'diamin e (TPD), 4,4'-bis[N-(1-naphthyl)-N-phenylamino]biphenyl ($\alpha$-NPD), and 4,4',4''-tris(3-methylphenylphenylamino)triphenylamine (m-MTDATA); and polyvinyl carbazole.

A high-molecular hole-transporting compound is also available, and examples thereof include polymer compounds including: triphenylamine-based low-molecular compounds polymerized by introducing polymerizable functional groups such as a polymer compound having a triphenylamine skeleton disclosed in JP 08-157575 A; polyparaphenylenevinylene; and polydialkylfluorene. Each of those hole-transporting compounds can be used alone, or may be used together with another hole-transporting compound as a mixture or lamination. The thickness of the hole-transporting layer is preferably 1 nm to 5 µm, more preferably 5 nm to 1 µm, still more preferably 10 nm to 500 nm.

Examples of an electron-transporting compound of which an electron-transporting layer in the organic electroluminescent element of the present invention is formed include known low-molecular electron-transporting compounds such as a quinolinol derivative metal complex (such as trisaluminumquinolinol ($Alq_3$)), an oxadiazole derivative, a triazole derivative, an imidazole derivative, and a triazine derivative. In addition, a high-molecular electron-transporting compound is also available, and examples thereof include the above low-molecular electron-transporting compounds polymerized by introducing polymerizable functional groups such as polyPBD disclosed in JP 10-1665 A. Each of those electron-transporting compounds can be used alone, or may be used together with another electron-transporting compound as a mixture or lamination. The thickness of the electron-transporting layer is preferably 1 nm to 5 µm, more preferably 5 nm to 1 µm, or still more preferably 10 nm to 500 nm.

The above phosphorescent polymer compound used for the light-emitting layer, the hole-transporting compound used for the hole-transporting layer, and the electron-transporting compound used for the electron-transporting layer may each form each layer alone, or each layer may be formed by using a polymer compound as a binder. Examples of the polymer compound to be used for the purpose include polymethyl methacrylate, polycarbonate, polyester, polysulfone, and polyphenylene oxide.

As described above, it is necessary to provide between electrodes an insulating layer like a dike or higher than the electrode surface, in conventional technique. However, according to the present invention, it is possible to provide an organic electroluminescent layer on each of the electrodes in a state that the organic electroluminescent layers are separate from each other, without providing an insulating layer or only by providing an insulating layer which is substantially as high as or lower than the electrode surface.

Each of the light-emitting layer (and if necessary, the hole-transporting layer and the electron-transporting layer) can be formed by means of, for example, a resistance heating deposition method, an electron beam deposition method, a sputtering method, an ink-jet method, a spin coating method, a dip coating method, a printing method, a spray method, a dispenser method or a nozzle-coating method. A resistance heating deposition method and an electron beam deposition method are mainly used in the case of low-molecular compounds, while an ink-jet method, a spin coating method, a nozzle-coating method, etc. are mainly used in the case of polymer compounds.

Thus, the present invention is effective mainly in forming pixels by means of coating method, and moreover, is also considerably effective in a case using low-molecule deposition method in that production of defective pixels inherent in a method involving formation of insulating layer can be avoided.

In the present Description, ink ejection method mainly includes inkjet method where coating solution is ejected in form of liquid droplets and nozzle coating method where coating solution is ejected in liquid column. Hereinbelow, these methods are described specifically.

The inkjet method is a method where a solution containing a material (in the present invention, an organic electroluminescent material) is ejected onto a substrate in form of fine liquid droplets from nozzle holes provided in the end of the ejection nozzle which is attached to a coating apparatus, to thereby form a layer comprising the material.

Figure 4:
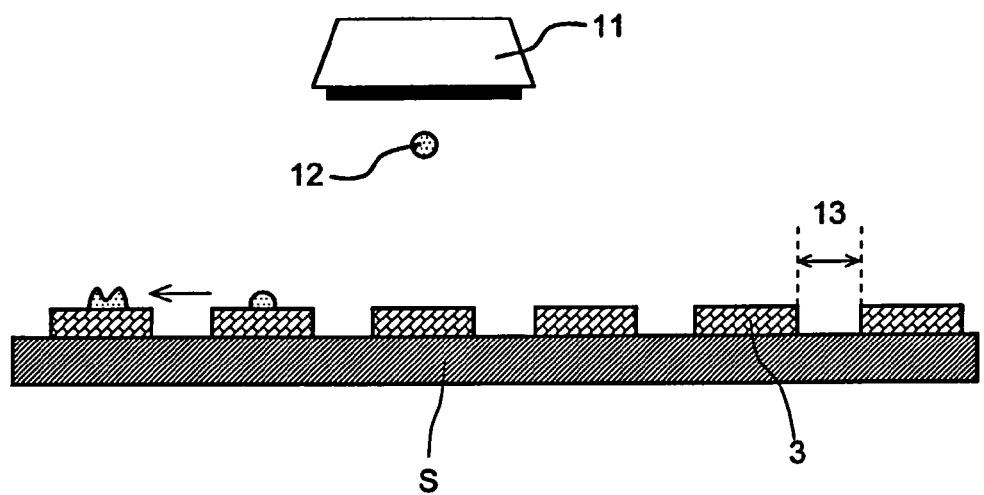
FIG. 4 is a sectional view showing a production process for the organic electroluminescent device (involving application of electroluminescent layers by ink-jet method) according to the present invention.

FIG. 4 is a sectional view for showing the production process of the electroluminescent device (coating process of the electroluminescent layer by means of inkjet method) according to the present invention. As shown in FIG. 4, an inkjet coater having a head part 11 smaller than substrate S is used and the head part 11 is placed above the substrate S. From nozzle 15 (ejection orifice) provided in the lower part of the head part 11, coating solution is ejected with high accuracy in form of fine droplets, so that the solution droplets land on an anode 3. After landing, the solution droplets spread about on the anode according to the volume of the droplet. By controlling the volume of the droplet, the droplets can land to cover the whole surface of the anode.

Conventionally, such an inkjet method, which easily enables fine patterning using polymer as a material, has been widely used.

The nozzle coating method is a method where a solution containing a material (in the present invention, an organic electroluminescent material) is ejected continuously and applied onto a substrate from a nozzle hole provided in the end of the ejection nozzle which is attached to a coating apparatus, to thereby form a layer comprising the material.

Figure 10:
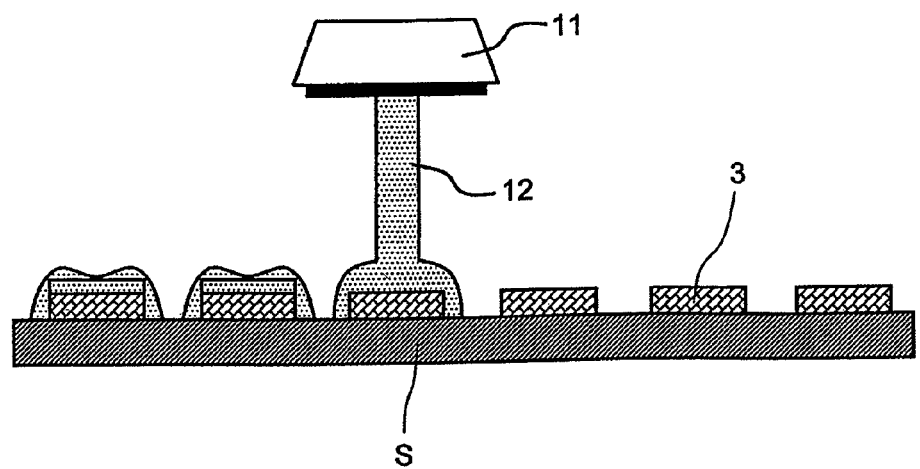
FIG. 10 is a schematic sectional view showing a production process for the organic electroluminescent device (involving application of electroluminescent layers by nozzle coating method) according to the present invention.

The ejection nozzle consists of a main body and an end member which can be attached and removed at will. Accordingly, even in a case where fluidity of the coating solution changes according to the kind or concentration of the solvent or where the optimum ejection rate of the coating solution changes according to the width of the substrate or the like, by preparing multiple kinds of nozzle end members having different nozzle hole diameters and selecting an end member having an appropriate nozzle hole diameter suitable for the coating conditions, uniform coating can be conducted on the substrate S and the anodes 3 on through ejection from the head part 11 in a state that the coating solution 12 is kept constantly ejected in form of liquid column as shown in FIG. 10, without ejecting the coating solution in droplets and without ejecting the solution in unnecessarily too large an ejection rate.

Figure 11:
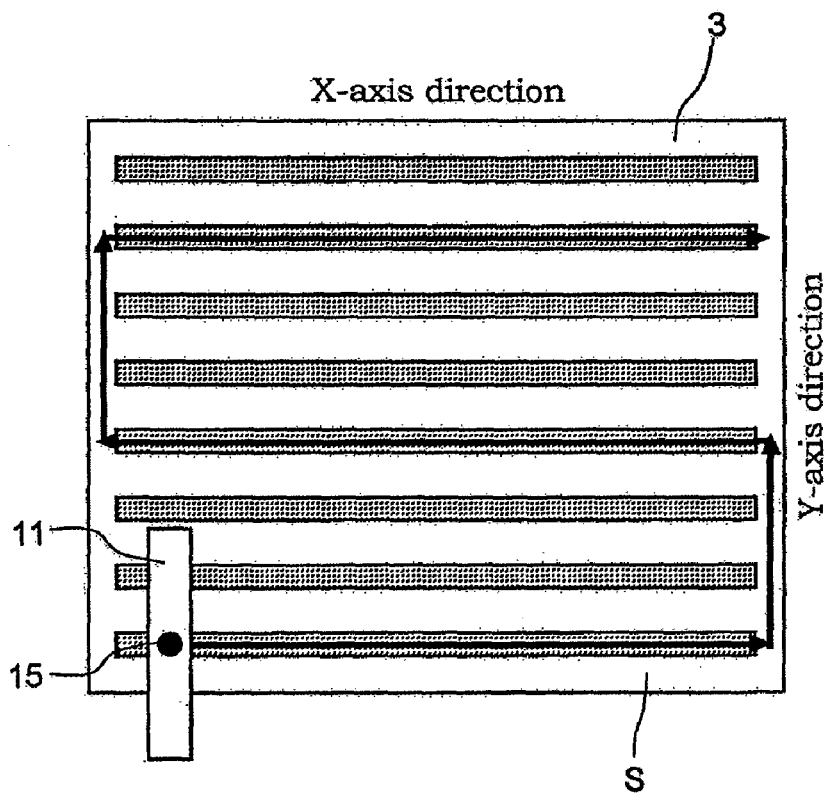
FIG. 11 is a schematic view showing a process of applying an electroluminescent compound by nozzle coating method in the production process of the organic electroluminescent device.

In the production method of the electroluminescent device according to the present invention, a coater head having one or more of such an ejection nozzle is prepared. As shown in FIG. 11, the coating solution is ejected and applied onto the substrate to form stripes, and by moving the coater head in the longitudinal direction (in the X-axis direction) with respect to the ITO substrate, the electroluminescent layer is applied on the ITO substrate.

When the coater head reaches the end of the long axis (X-axis), the coater head is moved in the short axis direction (Y-axis direction) and again moved along the long axis in the reverse direction. By repeating these operations, the electroluminescent material is applied sequentially on the ITO substrate.

In this mechanism, for example, when the width of the ITO substrate is 140 µm, by selecting a nozzle end member having a nozzle hole diameter of 15 µm, i.e., by using a nozzle end member having a nozzle hole diameter smaller than the width of the substrate, a wide margin can be obtained in positioning the nozzle and the substrate. Accordingly, the coating solution containing the electroluminescent material can be injected onto the substrate without missing the substrate.

The coater may be equipped with an input device and a display device. By inputting coating conditions into the input device, a proper nozzle hole diameter is determined according to the input information, and the optimum nozzle hole diameter is displayed by the display device.

Further, the coater may be equipped with a memory device. By storing information on coating conditions and relationship between coating conditions and proper nozzle hole diameters and setting such that a proper nozzle hole diameter is displayed by the display device upon input of a coating condition into the input device, selection of an appropriate nozzle hole diameter is easy.

A hole block layer may be arranged so as to be adjacent to the side of the cathode of the light-emitting layer for the purpose of suppressing the passage of a hole through the light-emitting layer in order that the hole may be efficiently recombined with an electron in the light-emitting layer. A compound whose level of the highest occupied molecular orbital (HOMO) level is deeper than that of the light-emitting compound can be used for the hole block layer, and examples thereof include a triazole derivative, an oxadiazole derivative, a phenanthroline derivative, and an aluminum complex.

Furthermore, an exciton block layer may be arranged so as to be adjacent to the side of the cathode of the light-emitting layer for the purpose of preventing an exciton from being deactivated by a cathode metal. A compound having triplet excitation energy larger than that of the light-emitting compound can be used for the exciton block layer, and examples thereof include a triazole derivative, a phenanthroline derivative, and an aluminum complex.

Figure 5:
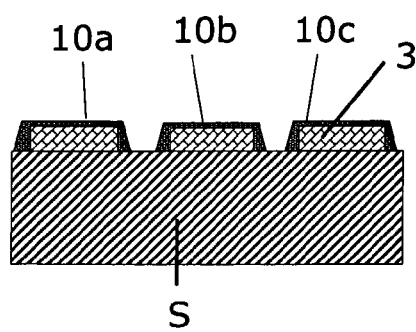
FIG. 5 is a schematic sectional view of a part of a substrate obtained by means of a method of the present invention involving applying an organic electroluminescent compound by using a substrate subjected to a water-repellent treatment.
Figure 12:
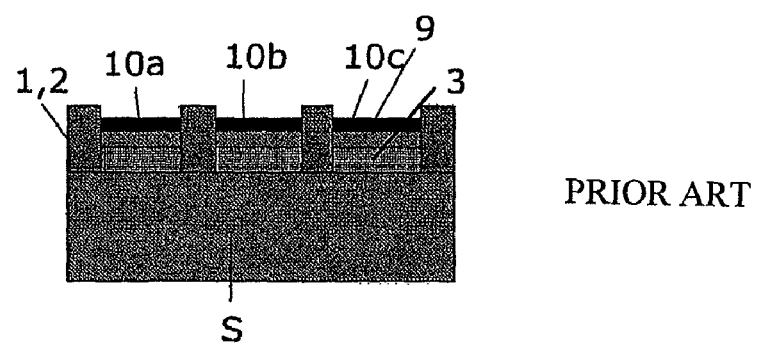
FIG. 12 is schematic sectional view showing the section of a part of a substrate to which an organic electroluminescent compound is applied by means of a conventional method.

FIG. 5 shows an example of the schematic sectional view of an organic electroluminescent device obtained by forming an organic electroluminescent layer on an anode glass substrate as described above. FIG. 12 shows a conventional organic electroluminescent device with an insulating layer and having a hole-injecting layer. According to the present invention, an organic electroluminescent layer can be subjected to patterning without the formation of an insulating layer. There are mainly three reasons why the patterning is effective in producing an organic electroluminescent device.

The first reason is that adjusting the water repellency of a substrate surface prevents an applied organic electroluminescent compound from spreading unnecessarily and from overlapping an adjacent pattern. The second reason is that the patterning is a surface treatment in which light can be emitted only by applying a single layer of an organic electroluminescent compound without the use of a water-soluble hole-injecting layer. The third reason is that the strong tendency that the edge portion of the coating film becomes thicker than the other portions when the applied polymer compound dries to form a film is advantageous. By using the advantages, the organic electroluminescent layer formed at the edge portion of ITO can be thicker.

<<Cathode>>

Next, a cathode (denoted by reference numeral 5 in FIG. 6) to be laminated on an organic electroluminescent layer will be described in detail. As a cathode material for the organic electroluminescent device of the present invention, a chemically stable material which has a low work function is used. Examples of such material include known cathode materials including: Al; an MgAg alloy; and an alloy of Al and an alkali metal such as AlLi or AlCa. In consideration of chemical stability, a work function is preferably 2.9 eV or more. A resistance heating deposition method, an electron beam deposition method, a sputtering method, an ion plating method, or the like can be used as a method of forming each of those cathode materials into a film. The thickness of the cathode is preferably 10 nm to 1 µm, or more preferably 50 nm to 500 nm.

In addition, for the purpose of reducing a barrier for electron injection from the cathode to the organic layer to thereby increase efficiency of injecting an electron, a metal layer having a work function lower than that of a cathode may be interposed as a cathode buffer layer between the cathode and an organic layer adjacent to the cathode. Examples of a metal having a low work function that can be used for such purpose include alkali metals (Na, K, Rb, and Cs), alkali earth metals (Sr and Ba), and rare earth metals (Pr, Sm, Eu, and Yb). In addition, an alloy or metallic compound having a work function lower than that of the cathode is also available. A deposition method, a sputtering method, or the like can be used as a method of forming such cathode buffer layer. The thickness of the cathode buffer layer is preferably 0.05 to 50 nm, more preferably 0.1 to 20 nm, still more preferably 0.5 to 10 nm.

Furthermore, the cathode buffer layer can be formed as a mixture of the above substance having a low work function and an electron-transporting compound. An organic compound to be used for the above-described electron-transporting layer can be used as the electron-transporting compound to be used in this case. A co-deposition method can be used as a film forming method in this case. When a film can be formed by applying a solution, various film forming methods such as a spin coating method, a dip coating method, and a spray method may be used in addition to the nozzle coating method according to the present invention as long as the solution is applied to the entire surface. The thickness of the cathode buffer layer in this case is preferably 0.1 to 100 nm, more preferably 0.5 to 50 nm, or still more preferably 1 to 20 nm.

Figure 6:
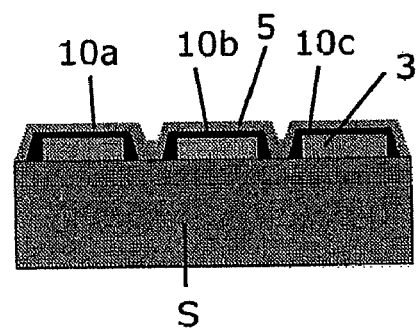
FIG. 6 is a schematic sectional view of a part of an organic electroluminescent device produced by means of the method of the present invention.
Figure 13:
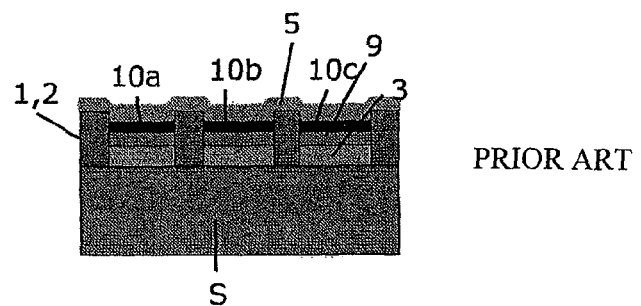
FIG. 13 is a schematic sectional view of a part of an organic electroluminescent device produced by means of a conventional method.

FIG. 6 shows an organic electroluminescent device thus completed, and FIG. 13 shows a device obtained by means of a conventional method.

The constitution of the organic electroluminescent element of the present invention is not limited to the example shown in FIG. 5. Examples of device constitution include an element structure in which 1) a light-emitting polymer compound layer/an electron-transporting layer, 2) a light-emitting polymer compound layer composed of a hole-transporting site and a light-emitting site/an electron-transporting layer, 3) a light-emitting polymer compound layer containing a hole-transporting compound, a light-emitting compound and an electron-transporting compound, 3) a layer containing a hole-transporting compound and a light-emitting compound, and 4) a layer containing a light-emitting compound and an electron-transporting compound are sequentially interposed between an anode and a cathode. Although the organic electroluminescent layer shown in FIG. 4 is composed of a single layer, two or more light-emitting layers may be arranged. In the Specification, unless otherwise stated, a compound obtained by polymerizing all or one or more kinds of an electron-transporting site, a hole-transporting site, and a light-emitting site, or a compound obtained by mixing all or one or more kinds of a hole-transporting compound, an electron-transporting compound, and a light-emitting compound is referred to as a light-emitting polymer compound, and a layer formed of such compound is referred to as a light-emitting compound layer.

As described above, the present invention relates to an organic electroluminescent device and also includes electronic devices such as a surface emission light source, a backlight for a device, an apparatus, a lighting apparatus or an interior or exterior accessory provided with this organic electroluminescent device.

EXAMPLES

Hereinafter, the present invention will be described in more detail by way of Examples and Comparative Examples. However, the present invention is by no means limited to the description of these Examples. In the following Examples, materials and layers formed of them are abbreviated as follows for simplification of description.

ITO: Indium tin oxide (anode),
ELP: Phosphorescent polymer (poly((di[4-(3,5-dimethyl-biphenyl)]-2,6-dimethyl-4-sty rylphenylborane-co-N,N,N'-tris(3-methylphenyl)-N'-(4-vinylph enyl)-1,1'-(3,3'-dimethyl)biphenyl-4,4'-diamine-co-(2-(4-vin ylphenyl)pyridine) bis(2-phenylpyridine)iridium (III)))

Reference Example 1

Figure 3:
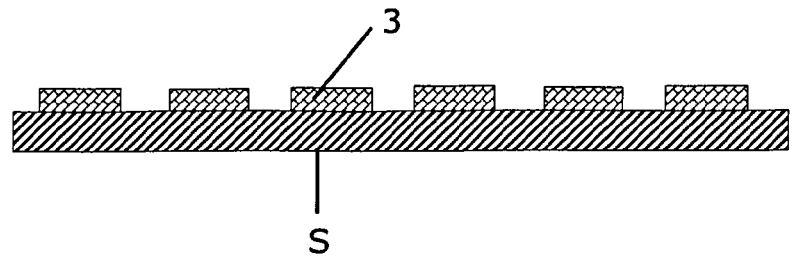
FIG. 3 is a schematic sectional view of a substrate to be used for an organic electroluminescent device according to the present invention.

As shown in FIG. 3, transparent electrodes (3) with indium tin oxide (ITO) were patterned in stripes on a substrate S (the substrate is hereinafter referred to as an anode substrate). The ITO of the anode substrate had a size of 30 μm and a height of 1,300 Å. The pixels were continuously arranged at a pitch of 80 μm.

[Surface Treatment for Substrate]

First, the anode substrate was washed with a liquid. That is, the anode substrate was subjected to ultrasonic cleaning by means of a commercially available detergent, and was then subjected to washing under running ultrapure water, to thereby produce an anode substrate A. The contact angle of the anode substrate A with respect to water was 10°.

The anode substrate A dried after the liquid washing was placed in a plasma generator. Treatment of irradiating oxygen plasma onto the ITO substrate for 30 seconds under an inner pressure of 1 Pa and an electric power supply of 150 W was conducted.

Next, the gas to be introduced was switched from oxygen to a $CHF_3$ gas, the flow rate of the gas was controlled, and the pressure was set to 7 Pa. The substrate was treated for 10 seconds in a PE mode with an input electric power of 300 W. The anode substrate after the treatment showed water repellency, and had a contact angle of 80° with respect to water. The anode substrate having water repellency thus produced was defined as an anode substrate B.

Each of the following solutions (1) to (3) was applied onto substrate A and substrate B by inkjet method, and the state of the solution spreading toward the periphery of the ITO was observed.

(1) BAYTRON: a solution prepared by diluting BAYTRON (poly(3,4-ethylenedioxythiophene)polystyrene sulfonic acid (manufactured by Bayer)) as a hole-injecting compound with IPA at a ratio of 1:1

(2) ELP-H: a solution prepared by dissolving 60 mg of ELP, as a coating solution for forming a light-emitting compound layer, into 1940 mg of anisole (manufactured by Wako Pure Chemical Industries, Ltd., extra-pure) and filtering the resultant solution through a filter having a pore size of 0.2 μm (3) ELP-L: a solution prepared by dissolving 30 mg of ELP, as a coating solution for forming a light-emitting compound layer, into 1970 mg of anisole (manufactured by Wako Pure Chemical Industries, Ltd., extra-pure) and filtering the resultant solution through a filter having a pore size of 0.2 μm After applying each of the solutions, solvent was removed in a vacuum (1 torr) and at room temperature over 30 minutes. After drying, the shape of each film obtained was observed with a PL microscope. Assuming that the distance between ITO electrodes each denoted by 13 in FIG. 4 is 1, Table 1 shows comparison between the cases using solution (1) to (3) with respect to the distance along which each of the films spread.

TABLE 1

|  | Anode substrate A | Anode substrate B |
| --- | --- | --- |
| (1) BAYTRON | 2 | −0.2 |
| (2) ELP-L | 0.6 | 0.3 |
| (3) ELP-H | 0.5 | 0.3 |

As shown in Table 1, on the hydrophilic anode substrate A, all of the three solutions (1) to (3) spread to contact with the skirts of the solution applied onto an adjacent ITO anode. In particular, hydrophilic BAYTRON (1) spread farther to the surface of the adjacent ITO anode, and in the cases using ELP, the tendency of spreading around was particularly remarkable in ELP-L (2) having a low concentration.

On the other hand, on the anode substrate B subjected to a water-repellent treatment, hydrophilic BAYTRON (1) remained in a spherical form on the ITO surface and did not spread. In the cases where ELP was applied, the length of the skirts of both films of (2) and (3) was within a pitch interval between electrodes, and neither of the films contacted with the skirts of the solution applied onto an adjacent ITO stripe.

Example 1 and Comparative Example 1

Figure 7:
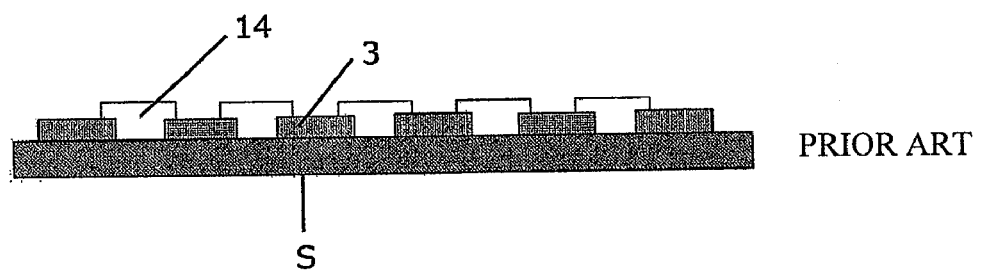
FIG. 7 is a schematic sectional view of a substrate to be used for an organic electroluminescent device according to a conventional method.
Figure 8:
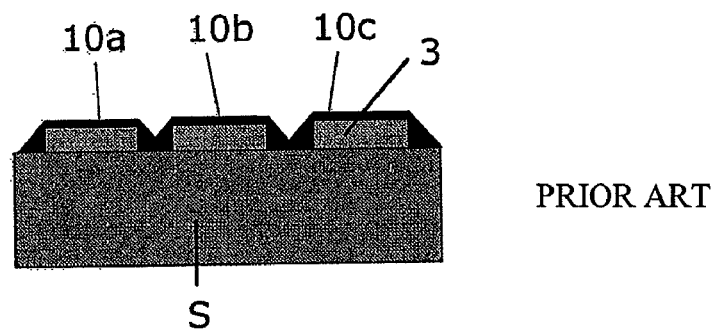
FIG. 8 is a schematic sectional view of a part of a substrate to which an organic electroluminescent compound is applied by means of a conventional method (Comparative Example) involving the use of a substrate not subjected to a water-repellent treatment.
Figure 9:
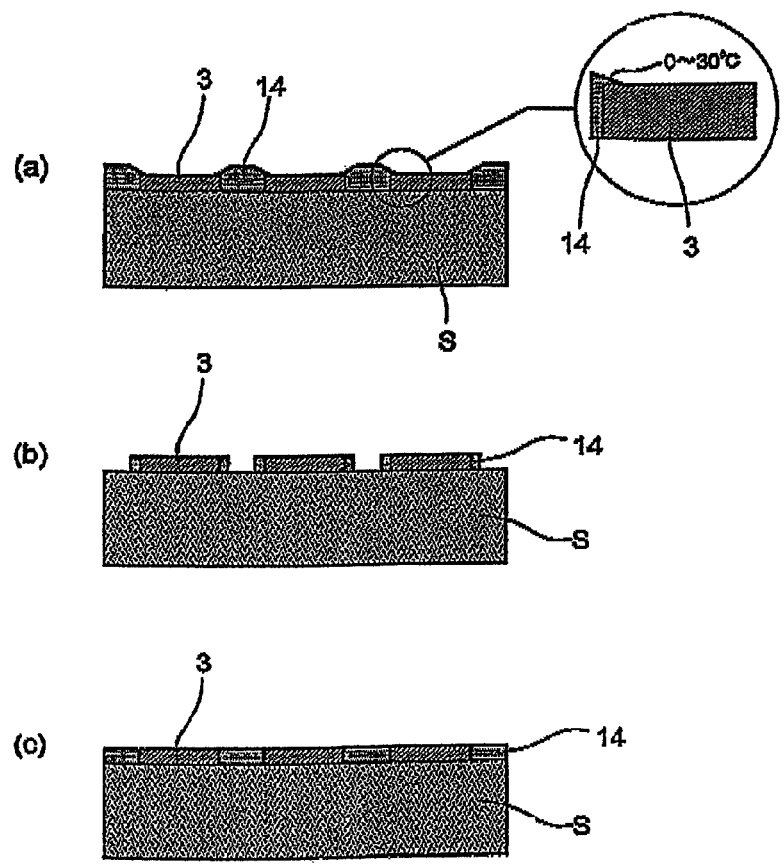
FIG. 9 is a sectional view showing a structure of the insulating layer according to the present invention.

FIG. 7 shows a state where an insulating layer (14) was formed by etching a polyimide layer through photolithography on the anode substrate S on which the ITO (3) was patterned. The opening of the insulating layer is 30 μm. The substrate has those pixels continuously arranged at a pitch of 80 μm. The substrate was washed with a liquid. The anode substrate dried after the washing with a liquid was placed in a plasma producing device and subjected to treatment of oxygen plasma irradiation for 5 seconds at a pressure of 1 Pa with an input electric power of 50 W.

Next, the kind of a gas to be introduced was switched from oxygen to a $CHF_3$ gas, the flow rate of the gas was controlled, and the pressure was set to 7 Pa. The substrate was treated for 10 seconds in a PE mode with an input electric power of 300 W. When compared with a separately prepared substrate which was provided with polyimide there on without water-repellent treatment, it was confirmed that the polyimide layer constituting the insulating layer after the treatment showed a contact angle with respect to water of 95°.

The anode substrate having a water-repellent insulating layer thus produced was defined as anode substrate C.

Then, the solution (1) prepared in Reference Example 1 was applied to the anode substrate C by means of an ink-jet method, and the whole was dried at room temperature for 20 minutes. After that, the resultant was dried in a no-atmospheric condition at 150° C. for 1 hour. Furthermore, the solution (3) prepared in Reference Example 1 was applied by means of an ink-jet method and laminated on the layer of the solution (1). The anode substrate C having formed thereon a light-emitting layer was placed in a deposition device, and calcium was deposited from the vapor at a deposition rate of 0.01 nm/s to have a thickness of 10 nm. Subsequently, aluminum was formed into a film having a thickness of 150 nm to serve as a cathode through sputtering. Finally, the resultant was sealed with an epoxy resin.

Similarly, after a light-emitting layer was formed by applying the solution (3) prepared in Reference Example 1 on the anode substrate B produced in Reference Example 1, a cathode was formed. The devices thus produced by using anode substrates C and B respectively were defined as organic electroluminescent device C and an organic electroluminescent device B, respectively.

With respect to 100 pixels prepared in parallel on each of the organic electroluminescent device, about 32 pixels which had defects such as short circuit were observed in the organic electroluminescent device C, and about 7 defective pixels were observed in the organic electroluminescent device B.

Figure 14:
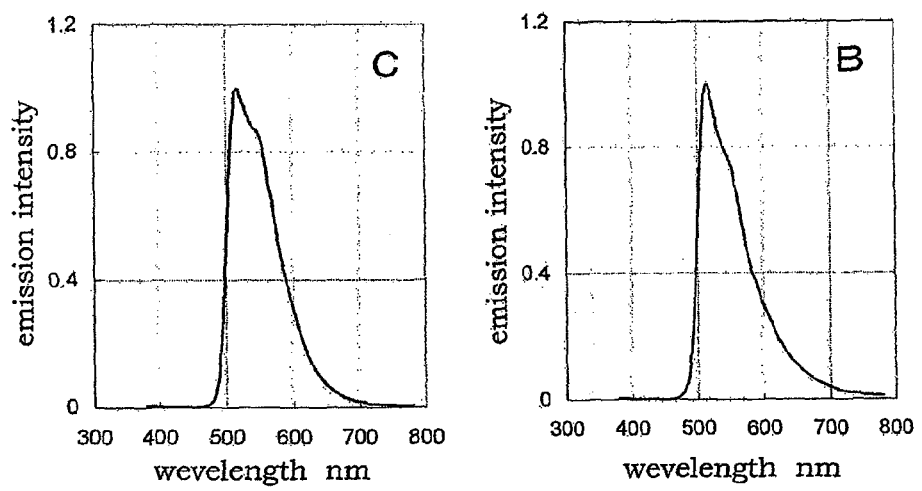
FIG. 14 shows emission spectra obtained from organic electroluminescent devices (a device B of Example and a device C of Comparative Example) produced by means of the production method of the present invention and a conventional production method.

FIG. 14 shows the emission spectra obtained by allowing the pixels in the organic electroluminescent devices C and B to emit light. As shown by the results, both of the obtained devices showed good green light emission.

Figure 15:
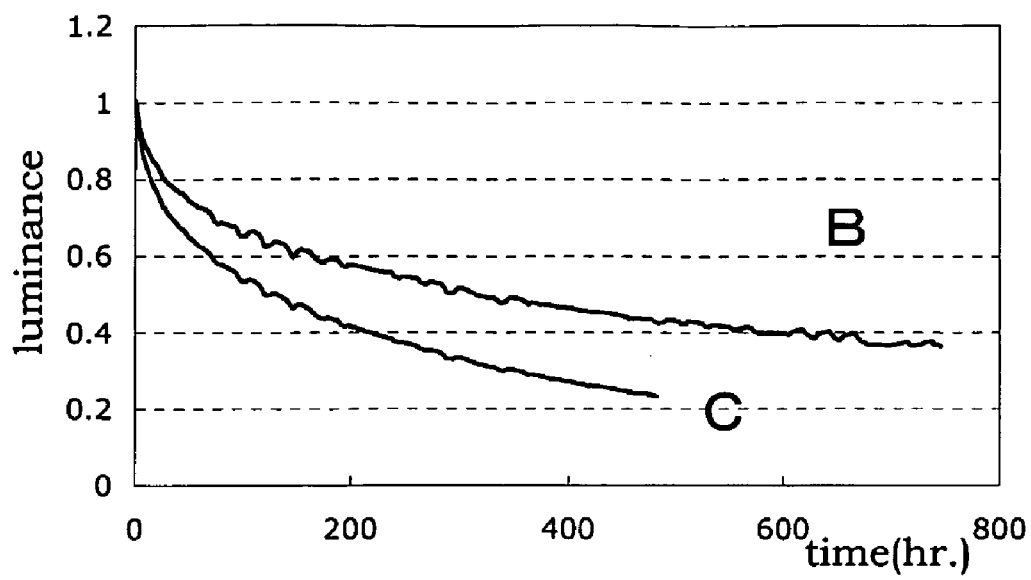
FIG. 15 is a graph showing the durability of each of the organic electroluminescent elements (the device B of Example and the device C of Comparative Example) produced by means of the production method of the present invention and the conventional production method.

In addition, FIG. 15 shows a graph obtained by comparing the lighting duration times of the pixels in organic electroluminescent devices C and B. Those results show that the organic electroluminescent device B produced without an insulating layer nor a hole-injecting layer is expected to provide improved yield and improved durability as compared to the organic electroluminescent device C using an insulating layer and a hole-injecting layer.

Reference Example 2

As shown in FIG. 3, transparent electrodes (3) with indium tin oxide (ITO) were patterned in stripes on a substrate S (the substrate is hereinafter referred to as an anode substrate 2). The ITO on the anode substrate 2 had a width of 140 µm and a height of 1,300 Å. The pixels were continuously arranged at a pitch of 130 µm.

[Surface Treatment for Substrate]

First, the anode substrate was washed with a liquid. That is, the anode substrate was subjected to ultrasonic cleaning by means of a commercially available detergent, and was then subjected to washing under running ultrapure water, to thereby produce an anode substrate 2A. The contact angle of the anode substrate 2A with respect to water was 10°.

The anode substrate 2A dried after the liquid washing was placed in a plasma generator and subjected to treatment of irradiating oxygen plasma for 30 seconds under an inner pressure of 1 Pa with an electric power supply of 150 W.

Next, the gas to be introduced was switched from oxygen to a $CHF_3$ gas, the flow rate of the gas was controlled, and the pressure was set to 7 Pa. The substrate was treated for 10 seconds in a PE mode with an input electric power of 300 W. The anode substrate after the treatment showed water repellency, and had a contact angle of 80° with respect to water. The anode substrate having water repellency thus produced was defined as an anode substrate 2B.

As coating solution for forming a light-emitting layer on anode substrate 2A and anode substrate 2B, solution (3) as prepared in Reference Example 1, that is, a solution was prepared by dissolving 60 mg of ELP into 1940 mg of anisole (manufactured by Wako Pure Chemical Industries, Ltd., extra-pure) and filtering the resultant solution through a filter having a pore size of 0.2 µm. This solution was applied onto anode substrate 2A and anode substrate 2B by nozzle-coating method. The conditions for nozzle coating are nozzle diameter of 15 µm, flow rate of 180 µl/min and operation speed of 3 m/second. Only in anode substrate 2A, every other ITO stripe was coated. After coating, the substrates were heat-dried at 100° C. for 15 minutes and the film thickness as measured was 800 Å.

Figure 16:
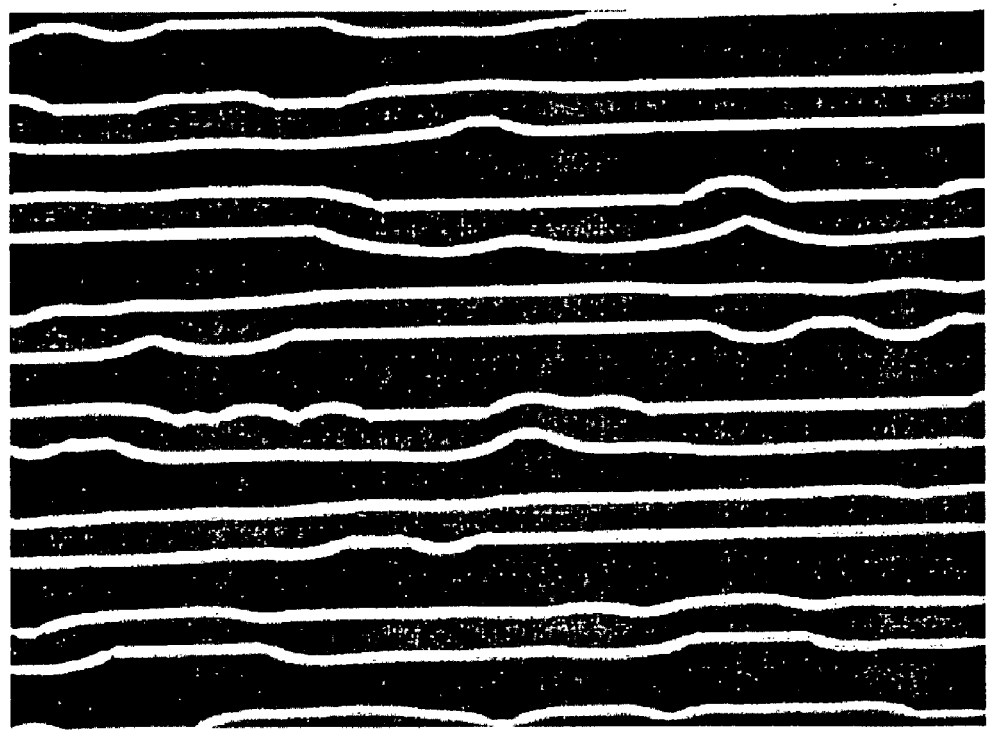
FIG. 16 is an image taken by photoluminescence (PL) microscope showing the surface condition of the anode substrate 2A prepared in Reference Example 2.
Figure 17:
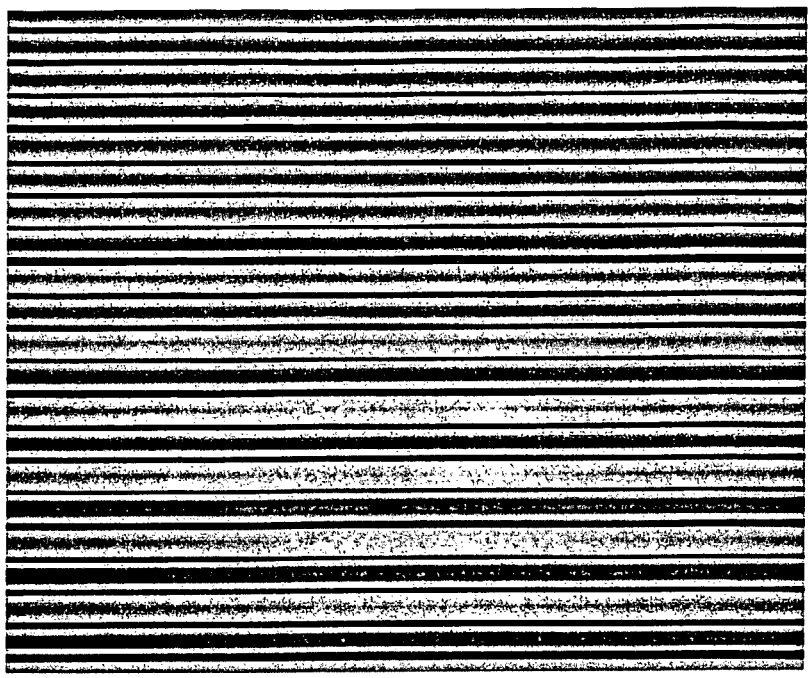
FIG. 17 is an image taken by photoluminescence (PL) microscope showing the surface condition of the anode substrate 2B prepared in Reference Example 2.

Light of 340 nm was irradiated onto the substrates 2A and 2B after coating with solution for forming a light-emitting layer, to thereby allow ELP to emit light, and the state of the surface was observed with a PL microscope. The results are shown in FIGS. 16 and 17. In anode substrate 2A (FIG. 16), apparently ELP sprawled to cover the surface of adjacent ITO electrodes. On the other hand, in anode substrate 2B (FIG. 17), the ELP film could be formed in good straight lines.

Figure 18:
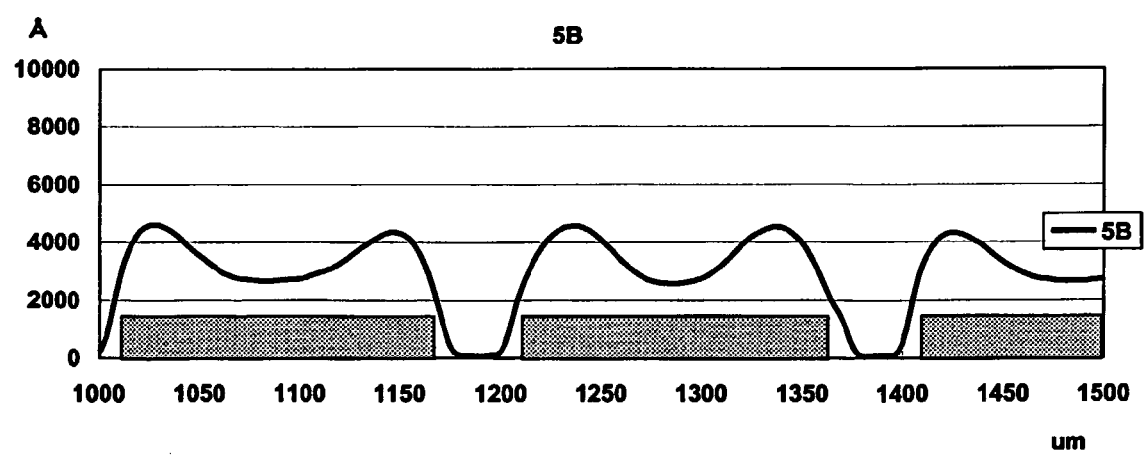
FIG. 18 shows the result of surface profiler measurement on the surface configuration of the anode substrate 2B prepared in Reference Example 2.

Also, the result of measurement on surface shapes of the substrate 2B after coating ELP as observed in a direction perpendicular to ITO stripes with a surface profiler (manufactured by KLA-TENCOR CORPORATION) is shown in FIG. 18. According to the result, ELP films did not overlap each other between adjacent ITO strips and apparently were disconnected. Moreover, the films were thicker at the film edge, so that prevention of short circuit at the edge portion can be expected.

Example 2 and Comparative Example 2

Figure 19:
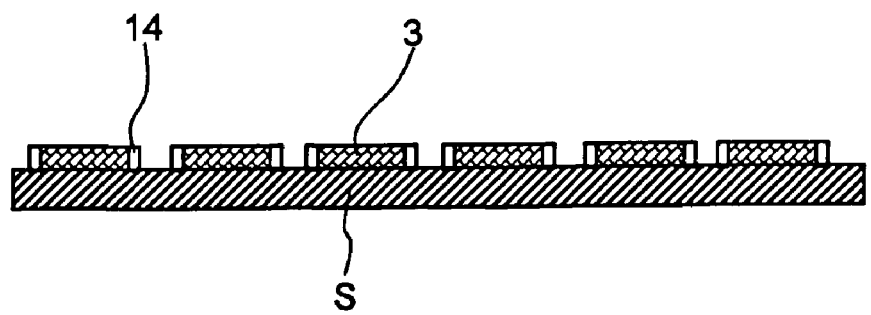
FIG. 19 is a schematic sectional view of the anode substrate 2C prepared in Example 2.

FIG. 19 shows a state where an insulating layer (14) was formed on both sides of ITO electrodes by etching a polyimide layer through photolithography on the anode substrate S on which the ITO (3) was patterned, so that the insulating layer was formed parallel to the ITO.

The opening of the insulating layer was 80 µm. The substrate had the pixels continuously arranged at a pitch of 80 µm. After the substrate was washed with a liquid and dried, the substrate was placed in a plasma producing device and subjected to treatment of oxygen plasma irradiation for 5 seconds at a pressure of 1 Pa with an input electric power of 50 W.

Next, the kind of a gas to be introduced was switched from oxygen to a $CHF_3$ gas, the flow rate of the gas was controlled, and the pressure was set to 7 Pa. The substrate was treated for 10 seconds in a PE mode at an input electric power of 300 W.

When compared with a separately prepared substrate which was provided with polyimide thereon without water-repellent treatment, it was confirmed that the polyimide layer constituting the insulating layer after the treatment showed a contact angle with respect to water of 95°.

The anode substrate having a water-repellent insulating layer thus produced was defined as anode substrate 2C. Then, the solution (2) prepared in Reference Example 1 was applied to the anode substrate 2C by means of nozzle-coating method. The thus prepared substrate 2C was placed in a deposition apparatus, and calcium was deposited at a deposition rate of 0.01 nm/s to have a thickness of 10 nm. Subsequently, aluminum was formed into a film having a thickness of 150 nm to serve as a cathode through sputtering. Finally, the resultant was sealed with an epoxy resin.

Similarly, a light-emitting layer was formed by applying the solution (2) prepared in Reference Example 1 on the anode substrate 2B produced in Reference Example 2, to thereby form a cathode.

Devices produced using the anode substrates 2C and 2B were defined as organic electroluminescent device 2C and an organic electroluminescent device 2B, respectively.

Figure 20:
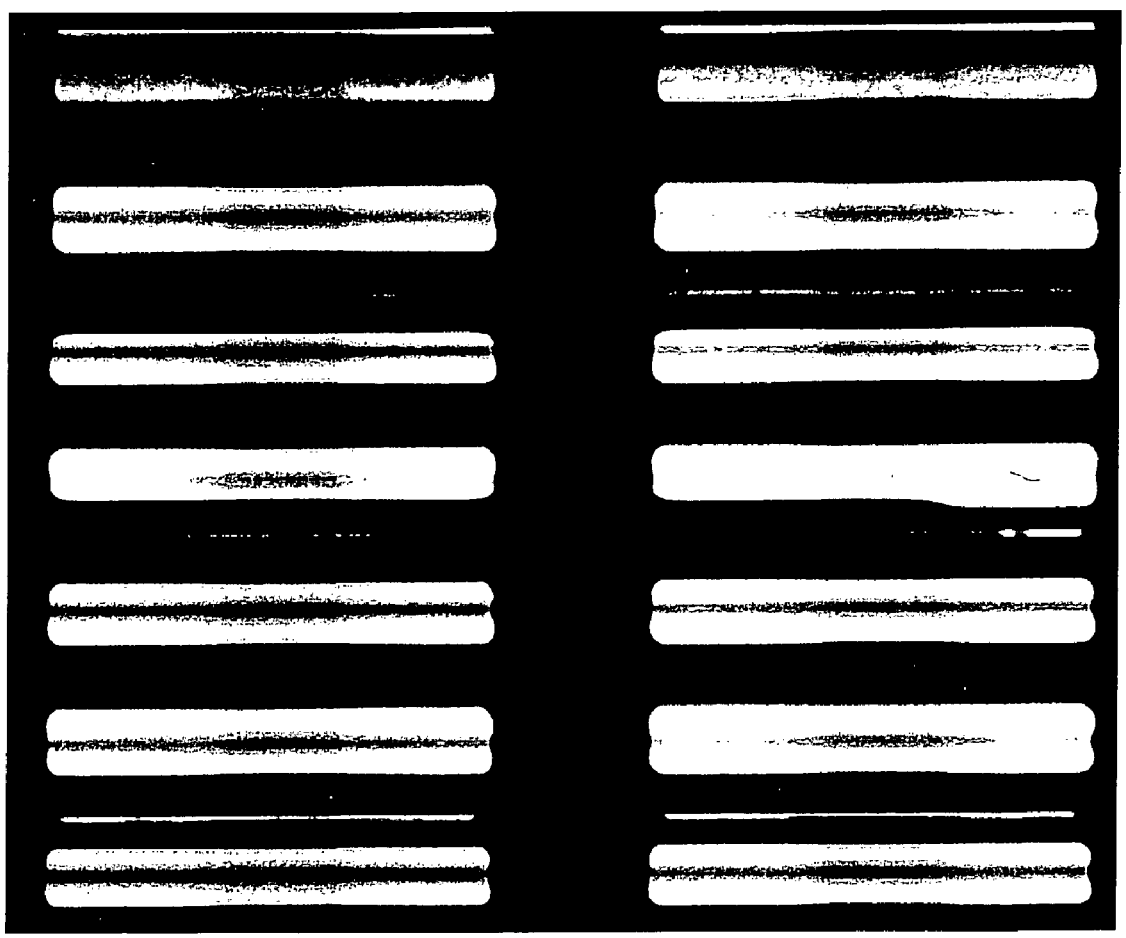
FIG. 20 is an emission photograph of the organic electroluminescent device 2C prepared in Comparative Example 2.

With respect to 100 pixels produced in parallel on each of the organic electroluminescent devices, in the organic electroluminescent device 2C, about 20 pixels which had defects such as short circuit were observed, and in the organic electroluminescent device 2B, about 3 defective pixels were observed. FIG. 20, which is an emission photograph of organic electroluminescent device 2C, shows that the emitting portions are non-uniform in width.

Example 3

Example of Sputtering Method

An ITO anode substrate was placed in a DC sputtering device (manufactured by Canon ANELVA Corporation) and the substrate surface was subjected to sputtering for 1 minute. The sputtering conditions were using $SiO_2$ as target, an input power of 0.3 kw, using nitrogen gas and a sputtering pressure of 1 Pa. The water-repellent anode substrate was defined as anode substrate 3. The contact angle of the substrate with respect to water was 70°.

After coating the substrate with ELP in the same manner as in Example 2, a cathode was formed, to thereby produce an organic electroluminescent device 3.

INDUSTRIAL APPLICABILITY

According to the method of the present invention, an organic electroluminescent light-emitting compound can be applied without the formation of an insulating layer on the surface of an anode substrate, the formation being indispensable to a conventional method, and hence a stable and high-performance organic electroluminescent device can be produced.

The invention claimed is:

1. A method of producing an organic electroluminescent device comprising:

applying a composition containing an organic electroluminescent compound onto multiple electrodes to form an organic electroluminescent layer on each of the electrodes, wherein a substrate on which the composition is applied is a substrate with one or both of portions between electrodes and a surface of the electrodes having been subjected to water-repellent treatment, the water-repellent treatment forming a water-repellent thin film, wherein around the multiple electrodes on which the water-repellent thin film is formed, an insulating layer is provided having a thickness of 500 nm or less as measured from the substrate surface and having an angle of 0 degrees as observed from the top surface of the electrodes, and the water repellant thin film is formed on the surface of the electrode, on the surface of the insulating layer and, when an opening is present in the insulating layer that exposes the underlying substrate surface, on the substrate surface.

2. The method of producing an organic electroluminescent device according to claim 1, wherein the water-repellent thin film has a thickness of 0.2 to 30 nm.

3. The method of producing an organic electroluminescent device according to claim 1, wherein the organic electroluminescent layer is a layer containing a polymer organic electroluminescent compound.

4. The method of producing an organic electroluminescent device according to claim 1, wherein the process of forming the water-repellent thin film is a treatment of forming a fluoride film on the surface of the substrate.

5. The method of producing an organic electroluminescent device according to claim 4, wherein the fluoride film is formed through a plasma treatment using a fluorocarbon-based compound as a reactant gas.

6. The method of producing an organic electroluminescent device according to claim 1, wherein the surface roughness of the water-repellent thin film is 1 nm or less in terms of Ra value.

7. The method of producing an organic electroluminescent device according to claim 1, wherein the height of a surface protrusion of the water repellent thin film is 10 nm or less.

8. The method of producing an organic electroluminescent device according to claim 1, wherein the water-repellent thin film is formed as an organic thin film by high frequency (RF) plasma method using a gaseous organic compound.

9. The method of producing an organic electroluminescent device according to claim 1, wherein after treating the anode (surface) with high frequency plasma, a thin film formed is subjected to optimization treatment to thereby become a water-repellent thin film.

10. The method of producing an organic electroluminescent device according to claim 1, wherein after treating the anode (surface) with high frequency plasma, a thin film is formed through high frequency (RF) plasma method using a gaseous organic compound and then the film is subjected to optimization treatment to thereby become a water-repellent thin film.

11. The method of producing an organic electroluminescent device according to claim 1, wherein the process of forming the water-repellent thin film involves treatment of the substrate surface by sputtering to thereby form a thin film of $SiO_2$.

12. The method of producing an organic electroluminescent device according to claim 9, wherein the optimization treatment is washing treatment using a solvent.

13. The method of producing an organic electroluminescent device according to claim 9, wherein the high frequency (RF) plasma method is conducted in a gas containing one or more kinds selected from a group consisting of oxygen, argon and fluorocarbon.

14. The method of producing an organic electroluminescent device according to claim 1, wherein the contact angle of water with respect to the water-repellent thin film is 30° or more.

15. The method of producing an organic electroluminescent device according to claim 1, wherein the composition containing the organic electroluminescent compound is applied onto the multiple electrodes by means of letterpress printing, intaglio printing, stencil printing or a non-plate printing method.

16. The method of producing an organic electroluminescent device according to claim 15, wherein the composition containing the organic electroluminescent compound is applied by non-plate printing through ink ejection process.

17. The method of producing an organic electroluminescent device according to claim 15, wherein the composition containing the organic electroluminescent compound is applied by non-plate printing through a nozzle coating method.

18. The method of producing an organic electroluminescent device according to claim 1, wherein the organic electroluminescent compound is a phosphorescent polymer compound.

19. The method of producing an organic electroluminescent device according to claim 1, wherein the organic electroluminescent compound is a fluorescent polymer compound or a non-conjugated phosphorescent polymer.

20. An organic electroluminescent device produced by the method described in claim 1.

21. A substrate for an organic electroluminescent device, which is produced by a process included in the method described in claim 1.

22. An electronic instrument including an organic electroluminescent device described in claim 20.

23. The electronic instrument according to claim 22, which is a surface emission light source, a backlight for a device, an apparatus, a lighting apparatus or an interior or exterior accessory.

* * * * *